United States Patent
Wright et al.

(10) Patent No.: US 10,394,707 B2
(45) Date of Patent: Aug. 27, 2019

(54) MEMORY CONTROLLER WITH MEMORY RESOURCE MEMORY MANAGEMENT

(71) Applicant: HEWLETT PACKARD ENTERPRISE DEVELOPMENT LP, Houston, TX (US)

(72) Inventors: Mitchel E. Wright, Houston, TX (US); Michael R Krause, Palo Alto, CA (US); Melvin K. Benedict, Houston, TX (US); Dwight L. Barron, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 79 days.

(21) Appl. No.: 15/527,620

(22) PCT Filed: Nov. 25, 2014

(86) PCT No.: PCT/US2014/067274
§ 371 (c)(1),
(2) Date: May 17, 2017

(87) PCT Pub. No.: WO2016/085463
PCT Pub. Date: Jun. 2, 2016

(65) Prior Publication Data
US 2017/0322876 A1 Nov. 9, 2017

(51) Int. Cl.
*G06F 11/20* (2006.01)
*G06F 12/02* (2006.01)
(Continued)

(52) U.S. Cl.
CPC ............ *G06F 12/023* (2013.01); *G06F 11/20* (2013.01); *G06F 12/0292* (2013.01);
(Continued)

(58) Field of Classification Search
CPC .. G06F 12/10; G06F 12/1027; G06F 12/1036; G06F 12/109; G06F 12/023;
(Continued)

(56) References Cited

U.S. PATENT DOCUMENTS 8,261,041 B2 9/2012 Kunimatsu
2010/0077253 A1 3/2010 Lynch et al.
(Continued)

FOREIGN PATENT DOCUMENTS

WO WO-2008057557 A2 5/2008

OTHER PUBLICATIONS

Egger, B. et al., "Scratchpad Memory Management for Portable Systems with a Memory Management Unit," (Research Paper), Oct. 22-25, 2006, 10 pages.
(Continued)

*Primary Examiner* — Shane D Woolwine
(74) *Attorney, Agent, or Firm* — Rathe Lindenbaum LLP

(57) ABSTRACT

In an example implementation according to aspects of the present disclosure, a memory controller is disclosed. The memory controller is communicatively coupleable to a memory resource having a plurality of memory resource regions, which may be associated with a plurality of computing resources. The memory controller may include a memory resource interface to communicatively couple the memory controller to the memory resource and a computing resource interface to communicatively couple the memory controller to the plurality of computing resources. The memory controller may further include a memory resource memory management unit to manage the memory resource.

20 Claims, 3 Drawing Sheets

(51) Int. Cl.
  *G06F 12/10* (2016.01)
  *G06F 13/28* (2006.01)
  *G06T 11/60* (2006.01)
  *G11C 16/10* (2006.01)
  *G06F 12/109* (2016.01)
  *G06F 12/1027* (2016.01)
  *G06F 12/1036* (2016.01)

(52) U.S. Cl.
  CPC .............. *G06F 13/28* (2013.01); *G06T 11/60* (2013.01); *G11C 16/10* (2013.01); *G06F 12/0284* (2013.01); *G06F 12/10* (2013.01); *G06F 12/109* (2013.01); *G06F 12/1027* (2013.01); *G06F 12/1036* (2013.01); *G06F 2212/1041* (2013.01); *G06F 2212/68* (2013.01)

(58) Field of Classification Search
  CPC .............. G06F 12/0284; G06F 12/0292; G06F 2212/1041; G06F 2212/68; G06F 11/20; G06F 12/029; G06F 13/28; G06T 11/60; G11C 16/10
  USPC .................................. 711/170, 202, 206, 207
  See application file for complete search history.

(56) References Cited

U.S. PATENT DOCUMENTS

| | | |
|---|---|---|
| 2010/0318761 A1 | 12/2010 | Moyer et al. |
| 2012/0117301 A1 | 5/2012 | Wingard |
| 2014/0049551 A1 | 2/2014 | Rao et al. |
| 2014/0195742 A1 | 7/2014 | Kim et al. |
| 2014/0281334 A1 | 9/2014 | Johnson et al. |
| 2014/0344498 A1 | 11/2014 | Sokolov et al. |

OTHER PUBLICATIONS

International Search Report & Written Opinion received in PCT Application No. PCT/US2014/067274, dated Aug. 6, 2015, 12 pages.

MEMORY CONTROLLER WITH MEMORY RESOURCE MEMORY MANAGEMENT

BACKGROUND

A computing device (e.g., desktop computer, notebook computer, server, cluster of servers, etc.) may incorporate various autonomous computing resources to add functionality to and expand the capabilities of the computing device. These autonomous computing resources may be various types of computing resources (e.g., graphics cards, network cards, digital signal processing cards, etc.) that may include computing components such as processing resources, memory resources, management and control modules, and interfaces, among others. These autonomous computing resources may share resources with the computing device and among one another.

BRIEF DESCRIPTION OF THE DRAWINGS

The following detailed description references the drawings, in which.

DETAILED DESCRIPTION

Figure 1:
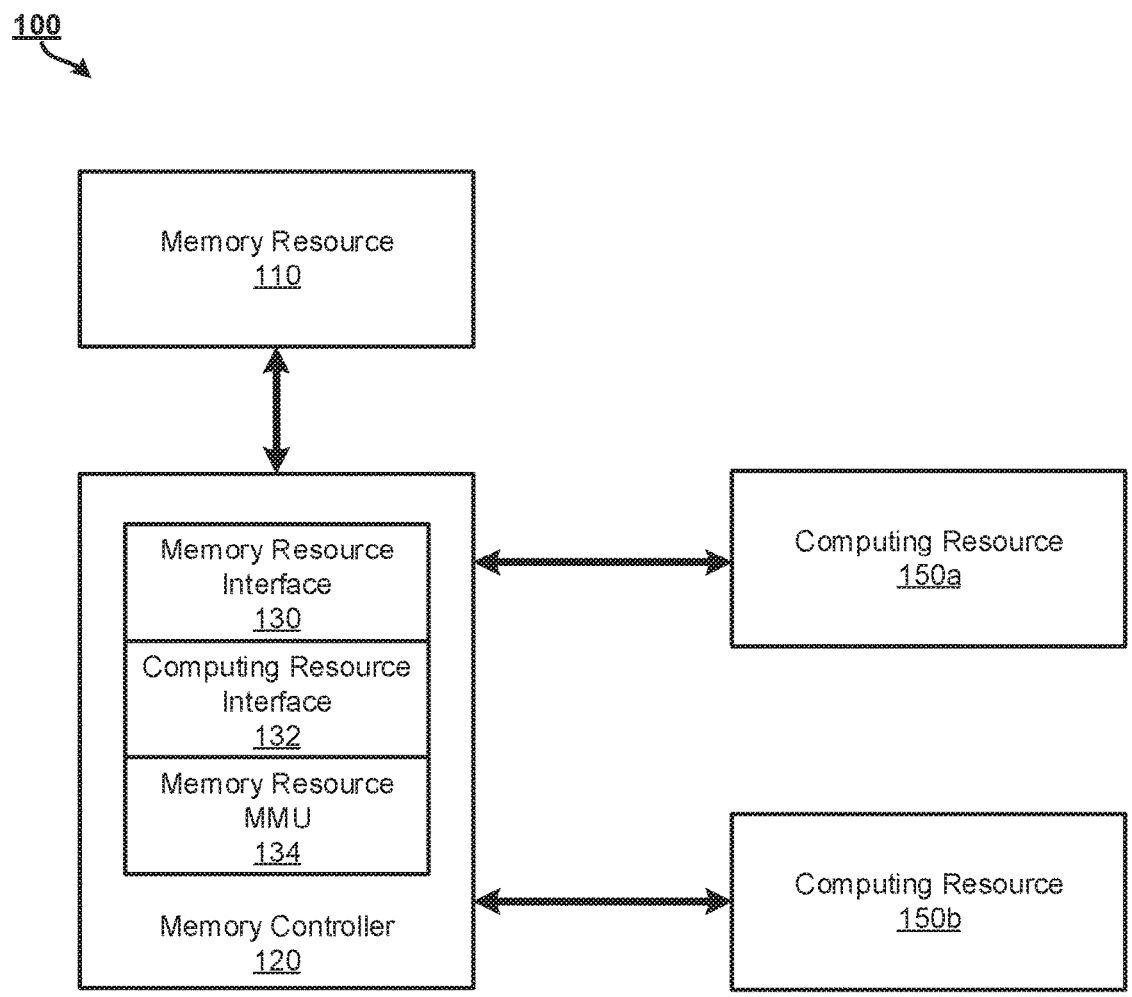
FIG. 1 illustrates a block diagram of a computing system including a memory controller communicatively coupleable to a memory resource and to a plurality of computing resources according to examples of the present disclosure.

A computing device (e.g., desktop computer, notebook computer, server, cluster of servers, etc.) may incorporate autonomous computing resources to expand the capabilities of and add functionality to the computing device. For example, a computing device may include multiple autonomous computing resources that share resources such as memory and memory management (in addition to the autonomous computing resources' native computing components). In such an example, the computing device may include a physical memory, and the autonomous computing resource may be assigned virtual memory spaces within the physical memory of the computing device. These computing resources, which may include systems on a chip (SoC) and/or other types of computing resources, that share a physical memory need memory management services maintained outside of the individual memory system address domains native to the computing resource.

In some situations, individual and autonomous compute resources manage the memory address space and memory domain at the physical memory level. However, these computing resources cannot co-exist to share resources with other individual and autonomous computing resources in a common physical memory domain. Moreover, these computing resources have limited physical address bits.

Various implementations are described below by referring to several examples of a memory controller. The memory controller is communicatively coupleable to a memory resource having a plurality of memory resource regions, which may be associated with a plurality of computing resources. The memory controller may include a memory resource interface to communicatively couple the memory controller to the memory resource and a computing resource interface to communicatively couple the memory controller to the plurality of computing resources. The memory controller may further include a memory resource memory management unit to manage the memory resource.

In some implementations, the present disclosure provides for managing and allocating physical memory to multiple autonomous compute and I/O elements in a physical memory system. The present disclosure enables a commodity computing resource to function transparently in the physical memory system without the need to change applications and/or operating systems. The memory management functions are performed by the memory controller of the physical memory system and are in addition to the native memory management functionality of the computing resources. Moreover, the memory management functions provide computing resource virtual address space translation to the physical address space of the physical memory system. Other address translation may also be performed, such as translation on process ID, user ID, or other computing resource dependent feature translation. Disclosed examples provide for better resource allocation, improved security, over subscription, and sharing. These and other advantages will be apparent from the description that follows.

Figure 2:
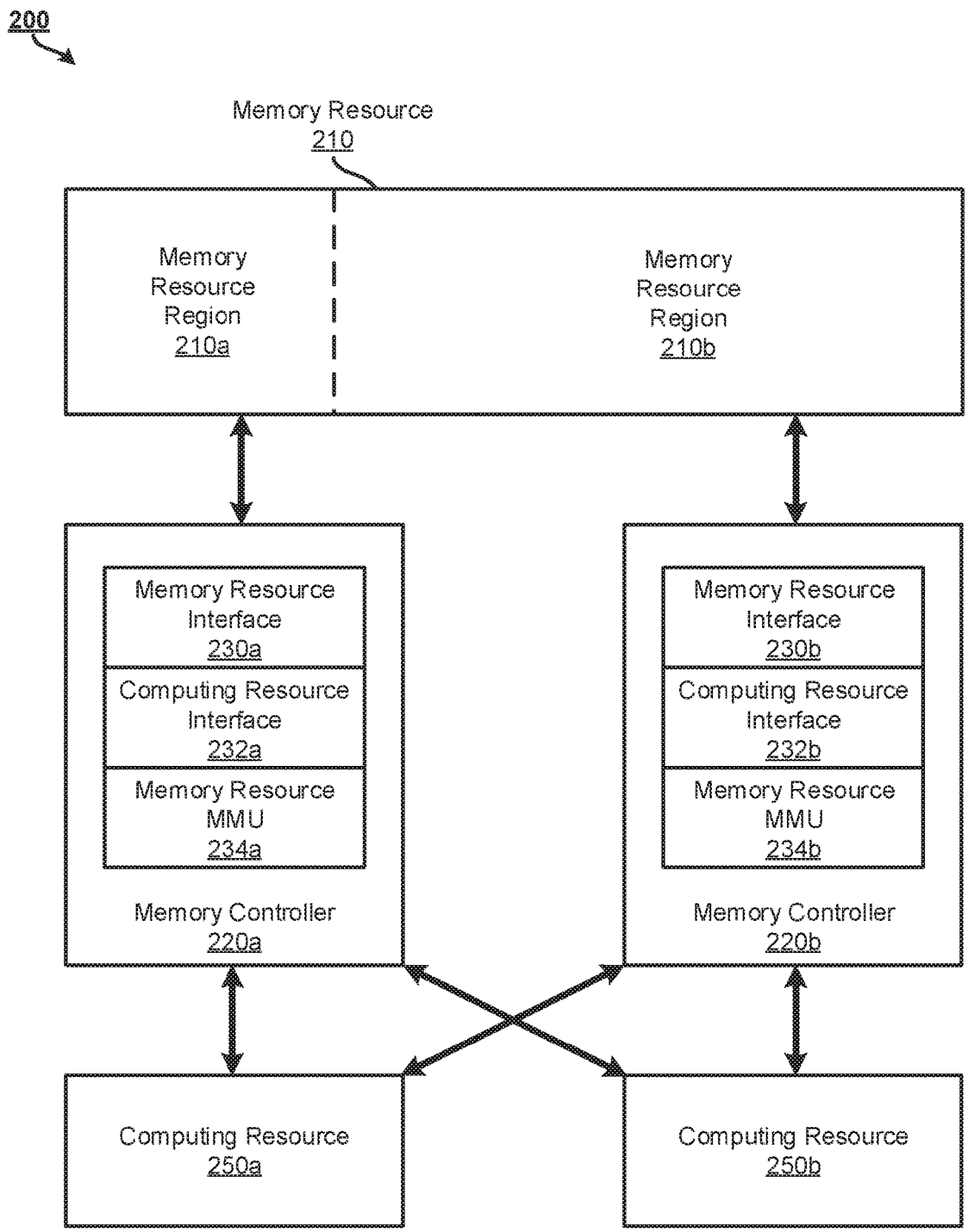
FIG. 2 illustrates a block diagram of a computing system including a plurality of memory controllers communicatively coupleable to a memory resource and to a plurality of computing resources according to examples of the present disclosure.

FIGS. 1 and 2 include particular components, modules, instructions etc. according to various examples as described herein. In different implementations, more, fewer, and/or other components, modules, instructions, arrangements of components/modules/instructions, etc. may be used according to the teachings described herein. In addition, various components, modules, etc. described herein may be implemented as instructions stored on a computer-readable storage medium, hardware modules, special-purpose hardware (e.g., application specific hardware, application specific integrated circuits (ASICs), embedded controllers, hardwired circuitry, etc.), or some combination or combinations of these.

Generally, FIGS. 1 and 2 relate to components and modules of a computing system, such as computing system 100 of FIG. 1 and computing system 200 of FIG. 2. It should be understood that the computing systems 100 and 200 may include any appropriate type of computing system and/or computing device, including for example smartphones, tablets, desktops, laptops, workstations, servers, smart monitors, smart televisions, digital signage, scientific instruments, retail point of sale devices, video walls, imaging devices, peripherals, networking equipment, or the like.

FIG. 1 illustrates a block diagram of a computing system 100 including a memory controller 120 communicatively coupleable to a memory resource 110 and to a plurality of computing resources 150a, 150b according to examples of the present disclosure. The memory controller 120 is responsible for managing the memory resource 110 and the data read and data write requests between the memory resource 110 and the computing resources 150a, 150b associated with the memory resource 110.

The memory controller 120 may be a general purpose computing resource that includes components such as a processing resource, a memory resource, a storage resource, and the like. In other examples, the memory controller 120 includes dedicated hardware, such as one or more integrated circuits, Application Specific Integrated Circuits (ASICs), Application Specific Special Processors (ASSPs), Field Programmable Gate Arrays (FPGAs), or any combination of the foregoing examples of dedicated hardware, for performing the techniques described herein. In some implementations, multiple processing resources (or processing resources utilizing multiple processing cores) may be used, as appropriate, along with multiple memory resources and/or types of memory resources.

Additionally, the memory controller 120 may include a memory resource interface 130, a computing resource interface 132, and a memory resource memory management unit (MMU). In one example, the memory resource MMU described herein may be a combination of hardware and programming. The programming may be processor executable instructions stored on a tangible memory resource such as memory resource 110, and the hardware may include a processing resource for executing those instructions. Thus memory resource 110 can be said to store program instructions that when executed by a processing resource implement the modules described herein. 134. In other examples, the memory controller 120 may include more or less components/modules/interfaces.

The memory resource interface 130 represents an interface to communicatively couple the memory controller 120 and the memory resource 110. For example, the memory resource interface 130 may represent a variety of market-specific and/or proprietary interfaces (e.g., copper, photonics, varying types of interposers, through silicon via, etc.) to communicatively couple the memory controller 120 and the memory resource 110. In examples, switches, routers, and/or other signal directing components may be implemented between the memory resource 110 and the memory resource interface 130 of the memory controller 120.

Similarly, the computing resource interface 132 represents an interface to communicatively couple the memory controller 120 and the computing resources 150*a*, 150*b*. For example, the computing resource interface 132 may represent a variety of market-specific and/or proprietary interfaces (e.g., copper, photonics, varying types of interposers, through silicon via, etc.) to communicatively couple the memory controller 120 and the computing resources 150*a*, 150*b*. In examples, switches, routers, and/or other signal directing components may be implemented between the computing resources 150*a*, 150*b* and the computing resource interface 132 of the memory controller 120.

The memory resource memory management unit (MMU) 134 manages the memory resource region (not shown) of the memory resource 110 associated with the plurality of computing resources 150*a*, 150*b*. The MMU 134 may use page tables containing page table entries as an example for a mapping (translation) database to map virtual address locations to physical address locations of the memory resource 110.

The memory resource MMU 134 may enable data to be read from and data to be written to the memory resource region of the memory resource 110 associated with the computing resources 150*a*, 150*b*. To do this, the memory resource MMU 134 may perform an address translation to perform a memory address translation to translate between a native memory address location of the computing resources 150*a*, 150*b* and a physical memory address location of the memory resource 110. For example, if the computing resource 150*a* desires to read data stored in memory resource region associated with the computing resource 150*a*, the memory resource MMU 134 of the memory controller 120 translates a native memory address location to a physical memory address location of the memory resource 110 (and being within the memory resource region associated with the computing resource 150*a*) to retrieve and read the data stored in the memory resource 110. Moreover, in examples, the memory resource MMU 134 may utilize a translation lookaside buffer (TLB) to avoid accessing the memory resource 110 each time a virtual address location of the computing resources 150*a*, 150*b* is mapped to a physical address location of the memory resource 110.

In some examples, the memory resource MMU 134 may further include a transaction module and a packet routing module. The transaction module manages transactions between the memory resource 110 and the computing resources 150*a*, 150*b*. For example, the transaction module may facilitate the data reads and data writes between the memory controller 120 and each of the memory resource 110 and the computing resources 150*a*, 150*b*. The packet routing module routes packets between one of the computing resource 150*a*, 150*b* and an associated region of the memory resource 110. For example, the packet routing module may route packets between computing resource 150*a* and a region of the memory resource 110 associated with the computing resource 150*a*. However, in such an example, the packets may not be routed to a region other than the region of the memory resource associated with the computing resource 150*a*. That is, memory resource regions not associated with a particular computing resource 150*a*, 150*b* are inaccessible to the other computing resources 150*a*, 150*b*. In such an example, a memory region associated with computing resource 150*a* is inaccessible to computing resource 150*b*. Likewise, a memory region associated with computing resource 150*b* is inaccessible to computing resource 150*a*.

In examples, the computing resources 150*a*, 150*b* may also include a processing resource that represents generally any suitable type or form of processing unit or units capable of processing data or interpreting and executing instructions. The processing resource may be one or more central processing units (CPUs), microprocessors, and/or other hardware devices suitable for retrieval and execution of instructions. The instructions may be stored, for example, on a non-transitory tangible computer-readable storage medium, such as memory resource 110, which may include any electronic, magnetic, optical, or other physical storage device that store executable instructions. Thus, the memory resource 110 may be, for example, random access memory (RAM), electrically-erasable programmable read-only memory (EPPROM), a storage drive, an optical disk, and any other suitable type of volatile or non-volatile memory that stores instructions to cause a programmable processor to perform the techniques described herein. In examples, memory resource 110 includes a main memory, such as a RAM in which the instructions may be stored during runtime, and a secondary memory, such as a nonvolatile memory in which a copy of the instructions is stored.

Alternatively or additionally, the computing resources 150*a*, 150*b* may include dedicated hardware, such as one or more integrated circuits, Application Specific Integrated Circuits (ASICs), Application Specific Special Processors (ASSPs), Field Programmable Gate Arrays (FPGAs), or any combination of the foregoing examples of dedicated hardware, for performing the techniques described herein. In some implementations, multiple processing resources (or processing resources utilizing multiple processing cores) may be used, as appropriate, along with multiple memory resources and/or types of memory resources.

In examples, the computing resources 150*a*, 150*b* may include a native memory management unit (MMU) to manage a native memory on the respective computing resource 150a, 150b. For example, the native MMU manages a native memory (not shown), such as a cache memory or other suitable memory, on the computing resource 150a, 150b. Such a native memory may be used in conjunction with a processing resource (not shown) on the computing resources to store instructions executable by the processing resource on the computing resource 150a, 150b. The native MMU cannot manage the memory resource 110 however.

FIG. 2 illustrates a block diagram of a computing system 200 including a plurality of memory controllers 220a, 220b communicatively coupleable to a memory resource 210 and to a plurality of computing resources 250a, 250b according to examples of the present disclosure. The memory resource 210 includes a plurality of memory resource regions 210a, 210b which are associated with the computing resources 250a, 250b respectively. As a result, each of the computing resources 250a, 250b may communicate with their respective memory resource regions 210a, 250b to read and write data to the memory resource, for example, via one of the memory controllers 220a, 220b.

The memory controllers 220a, 250b are independent, autonomous computing resources manage the memory resource 210 and the data transmissions between each of the computing resources 250a, 250b and the memory resource 210. In examples, the memory controllers 220a, 220b perform discovery and configuration of the computing system 200 components and elements, such as memory resource 210 and computing resources 250a, 250b.

In examples, the memory controllers 220a, 220b may be a general purpose computing resource that includes components such as a processing resource, a memory resource, a storage resource, and the like. In other examples, the memory controller 120 includes dedicated hardware, such as one or more integrated circuits, Application Specific Integrated Circuits (ASICs), Application Specific Special Processors (ASSPs), Field Programmable Gate Arrays (FPGAs), or any combination of the foregoing examples of dedicated hardware, for performing the techniques described herein. In some implementations, multiple processing resources (or processing resources utilizing multiple processing cores) may be used, as appropriate, along with multiple memory resources and/or types of memory resources.

By managing the memory resource 210, the memory controllers 220a, 20b maintain consistency and state of the distributed memory translation units. The memory controllers 220a, 220b also may handle memory exceptions and errors and provide both hardware fast path fault and exception messaging and complex software paths with logging and policies.

As illustrated in FIG. 2, each of the memory controllers 220a, 220b may include memory resource interfaces 230a, 230b, computing resource interfaces 232a, 232b, and memory resource memory management units (MMU) 234a, 234b. The memory resource interfaces 230a, 230b represent interfaces to communicatively couple the memory controllers 220a, 220b and the memory resource 210. For example, the memory resource interfaces 230a, 230b may represent a variety of market-specific and/or proprietary interfaces (e.g., copper, photonics, varying types of interposers, through silicon via, etc.) to communicatively couple the memory controllers 220a, 220b and the memory resource 210. In examples, switches, routers, and/or other signal directing components may be implemented between the memory resource 210 and the memory resource interfaces 230a, 230b of the memory controllers 220a, 220b respectively.

Similarly, the computing resource interfaces 232a, 232b represent interfaces to communicatively couple the memory controllers 220a, 220b and the computing resources 250a, 250b. For example, the computing resource interfaces 232a, 232b may represent a variety of market-specific and/or proprietary interfaces (e.g., copper, photonics, varying types of interposers, through silicon via, etc.) to communicatively couple the memory controllers 220a, 220b and the computing resources 250a, 250b. In examples, switches, routers, and/or other signal directing components may be implemented between the computing resources 150a, 150b and the computing resource interfaces 232a, 232b of the memory controllers 220a, 220b respectively.

The memory resource memory management units (MMUs) 234a, 234b manage the memory resource regions of the memory resource 210 associated with the plurality of computing resources 250a, 250b. The memory resource MMUs 234 may use page tables containing page table entries to map virtual address locations to physical address locations of the memory resource 210. In an example, memory resource MMU 234a may manage the memory resource region 210a while memory resource MMU 234b may manage memory resource region 210b. In examples with additional memory resource regions, each MMU 234a, 234b may be responsible for managing any number of the memory resource regions.

The memory resource MMUs 234a, 234b may enable data to be read from and data to be written to the memory resource region of the memory resource 210 associated with the computing resources 250a, 250b. To do this, the memory resource MMUs 234a, 234b may perform an address translation to perform a memory address translation to translate between a native memory address location of the computing resources 250a, 250b and a physical memory address location of the memory resource 210. For example, if the computing resource 250a desires to read data stored in memory resource region associated with the computing resource 250a, the memory resource MMU 234a of the memory controller 220a translates a native memory address location to a physical memory address location of the memory resource 210 (and being within the memory resource region associated with the computing resource 250a) to retrieve and read the data stored in the memory resource 210. Moreover, in examples, the memory resource MMUs 234a, 234b may utilize a translation lookaside buffer (TLB) to avoid accessing the memory resource 210 each time a virtual address location of the computing resources 250a, 250b is mapped to a physical address location of the memory resource 210. In examples, memory resource regions not associated with a particular computing resource are inaccessible to the other computing resources.

The computing resources 250a, 250b may be similar to the computing resources 150a, 150b of FIG. 1. For example, the computing resources 250a, 250b may include a processing resource to execute instructions on the computing resources 250a, 250b and to read data from and write data to a memory resource region of the memory resource associated with the computing resource 250a, 250b. The data reading and writing is performed through or via at least one of the memory controllers 120a, 250b. Additionally, the computing resources 250a, 250b may include a native memory management unit to manage a native memory on the computing resources 250a, 250b. It should be appreciated that the computing resources 250a, 250b may be configured differently from one another.

In examples, the computing resources 250a, 250b may be communicatively coupleable to the memory controllers 220a, 220b in a mesh configuration. That is, the computing resources 250a, 250b may be arranged such that each computing resource 250a, 250b is communicatively coupleable to each of the memory controllers 220a, 250b. Computing resource 250a is communicatively coupleable to both memory controller 220a and memory controller 220b. Likewise, computing resource 250b is communicatively coupleable to both memory controller 220a and memory controller 220b. In this way, the computing system 200 is provided with redundant memory controllers 220a, 220b for the computing resources 250a, 250b. In other examples, other topology arrangements are possible in addition to mesh arrangements, such as point-to-point, bus, star, ring, tree, daisy chain, and hybrid arrangements, including combinations thereof.

Figure 3:
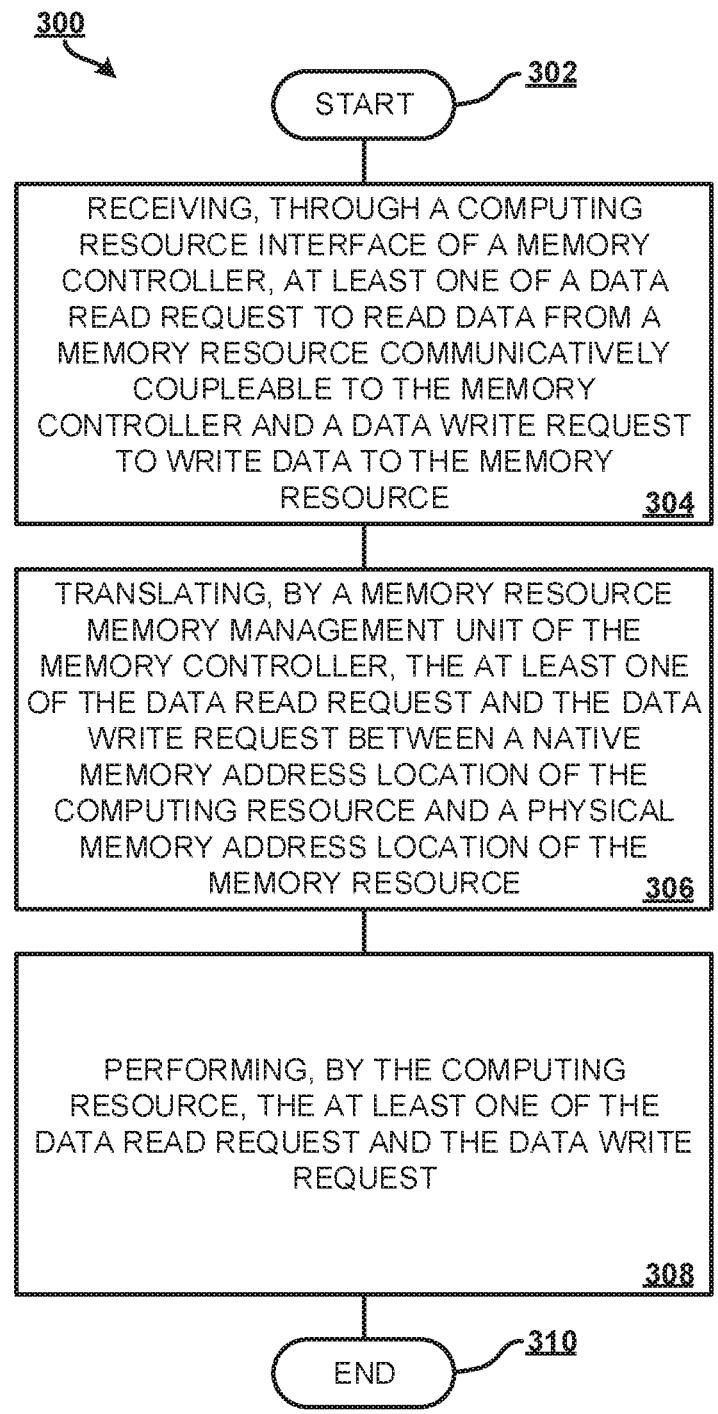
FIG. 3 illustrates a flow diagram of a method for translating data requests between a native memory address and a physical memory address of a memory resource by a memory resource memory management unit of a memory controller according to examples of the present disclosure.

In particular, FIG. 3 illustrates a flow diagram of a method 300 for translating data requests between a native memory address and a physical memory address of a memory resource by a memory resource memory management unit of a memory controller according to examples of the present disclosure. The method 300 may be stored as instructions on a non-transitory computer-readable storage medium such as memory resource 110 of FIG. 1, for example, or another suitable memory such as memory resource 210 of FIG. 2 that, when executed by a processing resource, cause the processing resource to perform the method 300, It should be appreciated that the method 300 may be executed by a computing system or a computing device such as computing system 100 of FIG. 1 and/or computing system 200 of FIG. 2.

At block 302, the method 300 begins and continues to block 304. At block 304, the method 300 includes receiving, through a computing resource interface of a memory controller (e.g., computing resource interface 132 of memory controller 120 of FIG. 1), at least one of a data read request to read data from a memory resource communicatively coupleable to the memory controller and a data write request to write data to the memory resource. The method 300 continues to block 306.

At block 306, the method 300 includes translating, by a memory resource memory management unit of the memory controller (e.g., memory resource MMU 134 of memory controller 120 of FIG. 1), the at least one of the data read request and the data write request between a native memory address location of the computing resource and a physical memory address location of the memory resource. In examples, the physical memory address location is located in a region of the memory resource associated with the computing resource. For example, in FIG. 2, the physical memory address location may be in memory resource region 210b if the memory resource region 210b is associated with computing resource 250b, Additionally, the native memory address location may be at least one of a native physical address location and a native virtual memory address location. The method 300 continues to block 308.

At block 308, the method 300 includes performing, by the computing resource (e.g., memory controller 120 of FIG, 1), the at least one of the data read request and the data write request. The method 300 continues to block 310 and terminates.

Additional processes also may be included, and it should be understood that the processes depicted in FIG. 3 represent illustrations, and that other processes may be added or existing processes may be removed, modified, or rearranged without departing from the scope and spirit of the present disclosure.

It should be emphasized that the above-described examples are merely possible examples of implementations and set forth for a clear understanding of the present disclosure. Many variations and modifications may be made to the above-described examples without departing substantially from the spirit and principles of the present disclosure. Further, the scope of the present disclosure is intended to cover any and all appropriate combinations and sub-combinations of all elements, features, and aspects discussed above. All such appropriate modifications and variations are intended to be included within the scope of the present disclosure, and all possible claims to individual aspects or combinations of elements or steps are intended to be supported by the present disclosure.

What is claimed is:

1. A memory controller communicatively coupleable to a memory resource having a plurality of memory resource regions being associated with a plurality of computing resources, the memory controller comprising:
    a memory resource interface to communicatively couple the memory controller to the memory resource;
    a computing resource interface to communicatively couple the memory controller to the plurality of computing resources; and
    a memory resource memory management unit to manage the memory resource,
    wherein the memory resource is coupled to a second memory controller, and
    wherein the memory controller and the second memory controller are coupled to the plurality of computing resources in a mesh configuration.

2. The memory controller of claim 1, wherein the memory resource memory management unit further comprises:
    a transaction module to manage transactions between the memory resource and the plurality of computing resources; and
    a packet routing module to route packets between an appropriate one of the plurality of computing resources and a respective one of the plurality of memory resource regions associated with the appropriate one of the plurality of computing resources.

3. The memory controller of claim 1, wherein memory resource regions not associated with a particular computing resource are inaccessible to the other computing resources.

4. The memory controller of claim 1, wherein the computing resource is selected from the group consisting of at least one of a system on a chip, a field-programmable gate array, a digital signal processing unit, and a graphic processing unit.

5. The memory controller of claim 1, wherein the memory resource memory management unit performs a memory address translation between a native memory address location of the computing resource and a physical memory address location of the memory resource.

6. The memory controller of claim 1, wherein at least one of the plurality of computing resources further comprises:
    a native memory management unit to manage a native memory on the computing resource.

7. The memory controller of claim 6, wherein the at least one of the plurality of computing resources further comprises:
    a processing resource to execute instructions on the computing resource and to read data from and write data to the memory resource region of the memory resource associated with the computing resource via at least one of the plurality of memory controllers.

8. The memory controller of claim 1, wherein the mesh configuration includes each computing resource of the plurality of computing resources is communicatively coupleable to each of the memory controller and the second memory controller.

9. A computing system comprising:
a memory resource further comprising a plurality of memory resource regions;
a plurality of computing resources, each of the plurality of computing resources being associated with one of the plurality of memory resource regions of the memory resource; and
a plurality of memory controllers, each memory controller further comprising:
a memory resource interface to communicatively couple the memory controller to the memory resource,
a computing resource interface to communicatively couple the memory controller to the plurality of computing resources, and
a memory resource memory management unit to manage the memory resource region of the memory resource associated with each of the plurality of computing resources,
wherein the plurality of memory controllers and the plurality of computing resources are communicatively coupleable in a mesh configuration.

10. The computing system of claims 9, wherein at least one of the plurality of computing resources further comprises:
a native memory management unit to manage a native memory on the computing resource; and
a processing resource to execute instructions on the computing resource and to read data from and write data to the memory resource region of the memory resource associated with the computing resource via at least one of the plurality of memory controllers.

11. The computing system of claim 9, wherein the memory resource memory management unit performs a memory address translation between a native memory address location of the computing resource and a physical memory address location of the memory resource.

12. The computing system of claim 9, wherein memory resource regions not associated with a particular computing resource are inaccessible to the other computing resources.

13. The memory controller of claim 8, wherein the memory controller and the second memory controller provide redundancy for each computing resource of the plurality of computing resources in the mesh configuration.

14. The computing system of claim 9, wherein the mesh configuration includes each computing resource of the plurality of computing resources is communicatively coupleable to each memory controller of the plurality of memory controllers.

15. The computing system of claim 9, wherein the plurality of memory controllers provide redundancy for each computing resource of the plurality of computing resources in the mesh configuration.

16. A method comprising:
receiving, from a first computing device of a plurality of computing devices, through a computing resource interface of a first memory controller of a plurality of memory controllers, at least one of a data read request to read data from a memory resource communicatively coupleable to the plurality of memory controllers and a data write request to write data to the memory resource;
translating, by a memory resource memory management unit of the first memory controller, the at least one of the data read request and the data write request between a native memory address location of the computing resource and a physical memory address location of the memory resource; and
performing, by the first computing resource, the at least one of the data read request and the data write request,
wherein the plurality of memory controllers and the plurality of computing resources are communicatively coupleable in a mesh configuration.

17. The method of claim 16, wherein the physical memory address location is located in a region of the memory resource associated with the computing resource.

18. The method of claim 16, wherein the native memory address location is at least one of a native physical address location and a native virtual memory address location.

19. The method of claim 16, wherein the mesh configuration includes each computing resource of the plurality of computing resources is communicatively coupleable to each memory controller of the plurality of memory controllers.

20. The method of claim 16, wherein the plurality of memory controllers provide redundancy for each computing resource of the plurality of computing resources in the mesh configuration.

* * * * *